US 6,559,952 B1

(12) United States Patent
Bokor et al.

(10) Patent No.: US 6,559,952 B1
(45) Date of Patent: May 6, 2003

(54) SYSTEM FOR INTERFEROMETRIC DISTORTION MEASUREMENTS THAT DEFINE AN OPTICAL PATH

(75) Inventors: Jeffrey Bokor, Oakland, CA (US); Patrick Naulleau, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/569,168

(22) Filed: May 11, 2000

(51) Int. Cl.[7] .................................................. G01B 9/02
(52) U.S. Cl. ...................................... 356/520; 356/515
(58) Field of Search ............................... 356/521, 520, 356/515

(56) References Cited

U.S. PATENT DOCUMENTS

| | | | |
|---|---|---|---|
| 5,548,403 A | | 8/1996 | Sommargren |
| 6,111,646 A | * | 8/2000 | Naulleau et al. ............ 356/494 |
| 6,118,535 A | * | 9/2000 | Goldberg et al. ........... 356/521 |
| 6,312,373 B1 | * | 11/2001 | Ichihara ...................... 356/515 |

OTHER PUBLICATIONS

A Phase–Shifting Point Diffraction Interferometer, Medecki et al, Optics Letters, Oct. 1996, 1–3.*
Sommargren, G.E., "Phase Shifting Diffraction Interferometry Measuring Extreme Ultraviolet Optics" *OSA TOPS on Extreme Ultraviolet Lithography*, 1996, vol. 4, Glenn D. Kubiak and Dan Kania, Optical Society of America.

* cited by examiner

*Primary Examiner*—Samuel A. Turner
(74) *Attorney, Agent, or Firm*—Fliesler Dubb Meyer & Lovejoy LLP (57) ABSTRACT

An improved phase-shifting point diffraction interferometer can measure both distortion and wavefront aberration. In the preferred embodiment, the interferometer employs an object-plane pinhole array comprising a plurality of object pinholes located between the test optic and the source of electromagnetic radiation and an image-plane mask array that is positioned in the image plane of the test optic. The image-plane mask array comprises a plurality of test windows and corresponding reference pinholes, wherein the positions of the plurality of pinholes in the object-plane pinhole array register with those of the plurality of test windows in image-plane mask array. Electromagnetic radiation that is directed into a first pinhole of object-plane pinhole array thereby creating a first corresponding test beam image on the image-plane mask array. Where distortion is relatively small, it can be directly measured interferometrically by measuring the separation distance between and the orientation of the test beam and reference-beam pinhole and repeating this process for at least one other pinhole of the plurality of pinholes of the object-plane pinhole array. Where the distortion is relative large, it can be measured by using interferometry to direct the stage motion, of a stage supporting the image-plane mask array, and then use the final stage motion as a measure of the distortion.

23 Claims, 3 Drawing Sheets

Object

FIG._6A

Pincushion

FIG._6B

Barrel

FIG._6C

SYSTEM FOR INTERFEROMETRIC DISTORTION MEASUREMENTS THAT DEFINE AN OPTICAL PATH

The U.S. Government has certain rights in this invention pursuant to Contract No. DE-AC03-76SF00098 between the United States Department of Energy and the University of California for the operation of the Lawrence Berkeley National Laboratory.

FIELD OF THE INVENTION

This invention relates to an apparatus and method of measuring both distortion and wavefront-aberration in optical systems such as a ringfield projection lithography camera. More particularly, the invention employs a point diffraction interferometer that can simultaneously make both measurements without reconfiguration.

BACKGROUND OF THE INVENTION

Extreme ultraviolet lithography is a promising technology for integrated circuit fabrication for feature sizes less than 0.1 µm. It is an optical projection lithography scheme using short wavelength radiation with all-reflective optics based on multilayer coatings.

Optical metrology is the characterization of systems, surfaces, and/or materials using optical methods. An area of optical metrology relates to the use of an interferometer to measure the quality of a test optic, such as a single or multiple element mirror or lens system.

One important recent application of optical metrology is the testing and alignment of projection optics for photolithography systems. Modern photolithography systems used to fabricate integrated circuits must continually image smaller features. In pursuit of this goal, systems are confronted with the diffraction limit determined in part by the wavelength of the light employed. To meet the challenge of imaging ever smaller features, photolithographic systems must employ successively shorter wavelengths. Over the history of integrated circuit fabrication technology, photolithography systems have moved from visible to ultraviolet and may eventually move to even shorter wavelengths such as extreme ultraviolet or to yet shorter X-ray radiation.

As with all optical imaging systems, photolithographic optics may have various aberrations such as spherical astigmatism and coma present. These aberrations must be identified and removed during the fabrication and/or alignment of the projection optics, or the projection optics would introduce substantial blurring in the image projected onto the wafer.

Interferometers may be employed to test the projection optics for various aberrations. Conventional interferometers, based upon the Michelson design for example, employ a single coherent light source (at an object plane) which is split into a test wave and a reference wave. The test wave passes through the optic under test and the reference wave avoids that optic. The test and reference waves are recombined to generate an interference pattern or interferogram. Analysis of the interferogram, and the resultant wavefront with, for example, Zernike polynomials, indicates the presence of aberrations.

The reference wave of the interferometer should be "perfect"; that is, it should be simple and well characterized, such as a plane or spherical wave. Unfortunately, beam splitters and other optical elements through which the reference beam passes introduce some deviations from perfection. Thus, the interferogram never solely represents the condition of the test optic. It always contains some artifacts from the optical elements through which the reference wave passes. While these artifacts, in theory, can be separated from the interferogram, it is usually impossible to know that a subtraction produces a truly accurate interferogram.

To address this problem, the phase-shifting point diffraction interferometer has been developed; it is a variation of the conventional point diffraction interferometer in which a transmission grating has been added to greatly improve the optical throughput of the system and add phase-shifting capability. The phase-shifting point diffraction interferometer (PS/PDI) is described in H. Medecki, et al., "Phase-Shifting Point Diffraction Interferometer", *Optics Letters*, 21(19), 1526–28 (1996), E. Tejnil, et al., "At-Wavelength Interferometry for EUV Lithography," *J. Vacuum Science & Tech.* B, 15, 2455–2461 (1997), K. A. Goldberg, et al., "Characterization of an EUV Schwarzchild Objective Using Phase-Shifting Point Diffraction Interferometry," *Proceeding SPIE*, 3048, 264–270 (1997), E. Tejnil, et al., "Phase-Shifting Point Diffraction Interferometry for At-Wavelength Testing of Lithographic Optics," *OSA Trends in Optics and Photonics: Extreme Ultraviolet Lithography*, Optical Society of America, Washington, D.C., 4, 118–123 (1996), K. A. Goldberg, "Extreme Ultraviolet Interferometry," doctoral dissertation, Dept. of Physics, Univ. of California, Berkeley (1997), and in the U.S. Pat. No. 5,835,217 "Phase-Shifting Point Diffraction Interferometer," Hector Medecki, which are all incorporated herein by reference.

Figure 6A:
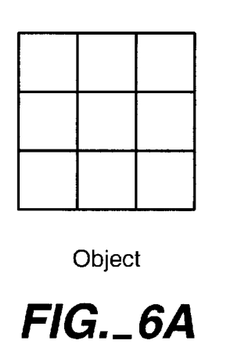
FIGS. 6A, 6B and 6C illustrate common distortion patterns.
Figure 6B:
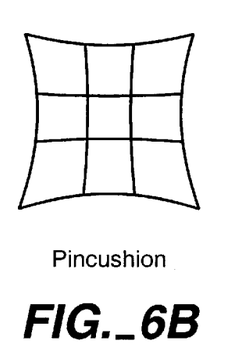
Figure 6C:
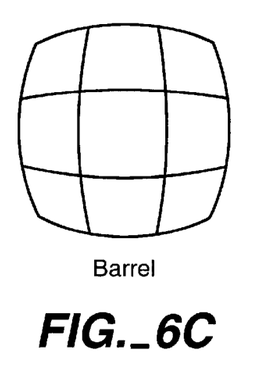

As with any multi-element diffraction limited imaging system, alignment is a crucial aspect in the development of extreme ultraviolet (EUV) projection lithography systems. For commercial quality performance, the alignment must also address the problem of distortion. Distortion in a projection optical system is related to image placement errors that vary as a function of position in the image field. For example, a uniformly distributed grid of points or object as shown in FIG. 6A would be imaged as a non-uniform grid in a system with distortion. Two common forms of distortion are the "barrel" and "pincushion" configurations which are depicted (in exaggerated form) in FIGS. 6B and 6C, respectively.

The conventional method of measuring distortion in photolithographic lenses involves printing wafers whereas the conventional method of measuring wavefront-aberration is interferometry as indicated above. It is known in the art, however, that performing the alignment based solely on wavefront-aberration minimization can introduce a significant amount of distortion into the system. This distortion could be several orders of magnitude larger than that specified by the optical design. This distortion could be too large to correct based on subsequent print measurement without affecting the wavefront performance, which would require further wavefront interferometry to correct. As is apparent, it would be advantageous to be able to measure both wavefront-aberration and distortion using a single instrument. Implementing the conventional printing method for measuring distortion on an EUV interferometry beamline, however, is not feasible due to the severely disparate illumination required for interferometry and full-field printing. When using point diffraction interferometry to characterize an example lithographic optical system, a micron sized illumination spot is required in the object plane, whereas for full-field printing 4-inch-wide arc-field illumination might be required.

SUMMARY OF THE INVENTION

The present invention is based in part on the recognition that the phase-shifting point diffraction interferometer can also be employed to directly measure distortion. Indeed, the improved PS/PDI of the present invention can measure wavefront aberration and distortion in a single instrument without any reconfiguration. This greatly simplifies the complicated task of aligning diffraction limited optical systems.

In one embodiment, the invention is directed to system for interferometric distortion measurements that defines an optical path, said system including:

(a) a test optic with an extended field of view;

(b) a source of electromagnetic radiation in the optical path;

(c) an object-plane pinhole array comprising a plurality of object pinholes with known positions located between the test optic region and the source of electromagnetic radiation whereby energy passing through any one of the plurality of object pinholes is spatially coherent;

(d) a beam divider in the optical path for dividing electromagnetic radiation from the source into a reference beam and a test beam;

(e) an image-plane mask array that is positioned in the image plane of the test optic wherein the image-plane mask array comprises a plurality of test windows and corresponding reference pinholes of known positions, wherein the positions of the plurality of object pinholes in the object-plane pinhole array register with those of the plurality of test windows in image-plane mask array to account for optic demagnification; and (f) means for directing electromagnetic radiation from the source of electromagnetic radiation into a first object pinhole of the object-plane pinhole array to thereby create a first corresponding test-beam image on the image-plane mask array.

The system can also include means for directing the electromagnetic radiation successively through the first pinhole and thereafter to one or more other pinholes of the plurality of pinholes of the object-plane mask array.

In another embodiment, the invention is directed to a method of measuring the distortion of a test optic defining multiple field points which includes the steps of:

(a) providing a point diffraction interferometer defining an optical path that includes (i) a test optic having a test optic region at which the test optic defines multiple field points, (ii) a source of electromagnetic radiation in the optical path, (iii) an object-plane pinhole array comprising a plurality of object pinholes of known positions located between the test optic region and the source of electromagnetic radiation whereby energy passing through any one of the plurality of object pinholes is spatially coherent, (iv) a beam divider in the optical path for dividing electromagnetic radiation from the source into a reference beam and a test beam, (v) an image-plane mask array that is positioned in the image plane of the test optic region wherein the image-plane mask array comprises a plurality of test windows and corresponding reference pinholes of known positions wherein the positions of the plurality of object pinholes in the object-plane pinhole array register with those of the plurality of test windows in the image-plane mask array to account for optic demagnification;

(b) directing electromagnetic radiation from the source of electromagnetic radiation into a first object pinhole of the plurality of object pinholes of the object-plane pinhole array to thereby create a corresponding first test-beam image and reference-beam image on the image-plane mask array;

(c) measuring the separation distance between and the orientation of the test-beam image and the center of the test-beam window; and (d) repeating steps (b) and (c) for at least one other object pinhole of the plurality of object pinholes of the object-plane pinhole array.

In a further embodiment the invention is directed to a method of measuring the distortion of a test optic which includes the steps of:

(a) providing a diffraction interferometer defining an optical path that includes (i) an imaging system with real conjugates, (ii) a test optic with an extended field of view, (iii) a source of electromagnetic radiation in the optical path, and (iv) a beam divider in the optical path for dividing the electromagnetic radiation into at least two beams;

(b) measuring a first interferometric pattern of the two beams at a first arbitrary field point within the optic's field of view, said point providing a reference wherein the distortion is defined to be zero;

(c) measuring a second interferometric pattern of the two beams at a second arbitrary field point within the optic's field of view; and (d) calculating the distortion in the test optic by comparing the measurements made in step (c) to the measurement made in step (b).

In yet another embodiment, the invention is directed to a method of measuring the distortion of a test optic which includes the steps of:

(a) providing a diffraction interferometer defining an optical path that includes (i) means for separating a beam of light into a reference beam and a test beam and (ii) a test optic with an extended field of view;

(b) measuring a first interferometric pattern of the two interferometric beams at a first arbitrary field point within the optic's field of view, said point providing a reference wherein the distortion is defined to be zero;

(c) measuring a second interferometric pattern of the two beams at a second arbitrary field point within the optic's field of view; and (d) calculating the distortion in the test optic by comparing the measurements made in step (c) to the measurement made in step (b).

DESCRIPTION OF PREFERRED
EMBODIMENTS

Figure 1:
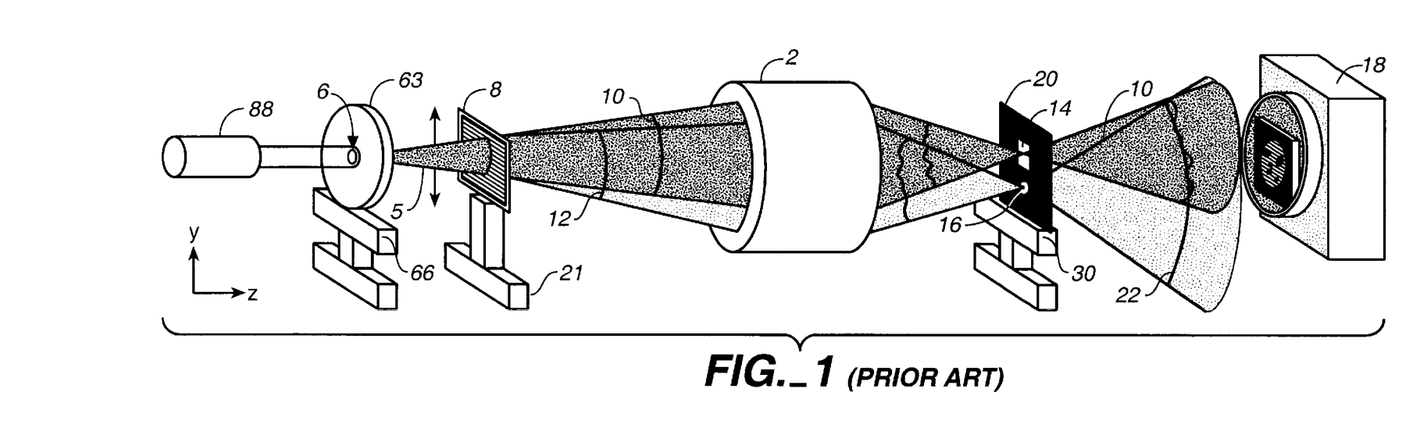
FIG. 1 is illustrates a phase-shifting point diffraction interferometer (PS/PDI)

A PS/PDI device that can be employed to measure wavefront aberration and distortion is shown in FIG. 1. In the PS/PDI, the optical system 2 under test is illuminated by a spherical wave 5 generated by pinhole diffraction from an object pinhole 6 in a substrate 63, which is positioned on object-plane stage 66 and placed in the object plane of the optical system under test. The PS/PDI has radiation source 88. A preferred electromagnetic radiation source which provides coherent illumination is a synchrotron undulator beamline source (CXRO beamline 12.0.1.2 at the Advanced Light Source, Lawrence Berkeley National Laboratory) operating at a wavelength of 13.4 nm with a variable bandwidth $\lambda/\Delta\lambda$ between about 200 and 1000. Preferably, the wavelength ranges from about 5 nm to 20 nm. To assure the quality of the spherical wave illumination, object pinhole 6 is chosen to be smaller than the diffraction-limited resolution of the optical system. The illumination wave is split using a transmission grating 8 to create the required test 10 and reference 12 beams. The multiple orders from the grating are focused by the optical system 2 to the image plane where an image-plane mask 20 (also referred to as the PS/PDI mask) is placed. The mask is attached to a high accuracy image plane stage 30. The PS/PDI mask is used to block the unwanted orders generated by the grating 8 and to produce the interferometric reference beam 22 by way of pinhole diffraction using reference pinhole 16. The mask also has a window through which the test beam passes. The test beam 10, which contains the aberrations imparted by the optical system, is largely unaffected by the mask owing to the large size of the test-window 14 relative to the point-spread function (PSF) of the optical system under test. The test- and reference-beams propagate to the mixing plane where they overlap to create an interference pattern on a charged coupled detector (CCD) 18. The size of the reference pinhole on the mask significantly influences the accuracy of the point diffraction interferometer. The reference pinhole must be smaller than the diffraction-limited focal spot of the optic under test. Thus, the pinhole diameter should approach the wavelength of the radiation. Additionally, a small pinhole ensures that there is sufficient divergence of the reference beam. The angle, in radians, of the radiation emitted from the pinhole covers an angle given by the expression:

$$\alpha = 1.22 \lambda/d$$

where $\lambda$ is the radiation wavelength, and d is the diameter of the pinhole. The quality of the reference wave is improved by using a small pinhole at the expense of signal amplitude. A translation of the grating beam splitter 8 in the direction normal to the grating rulings produces a controllable phase shift between any two diffractive orders, and is used to implement phase-shifting interferometry. Between two adjacent orders, a translation of the grating by one grating period produces a relative phase shift of $2\pi$ radians, or one wave. Since small beam separations are typically used, the grating can be quite coarse, making fractional cycle translations easily achievable by the translation stage 21.

The PS/PDI may be configured many different ways. The source of electromagnetic radiation may be, for example, a laser or some other quasi-monochromatic source. If the source of radiation provides a spherical wave, the interferometer does not need to include the entrance pinhole through which radiation passes before it illuminates the test optic as described above.

The beam divider is preferably, though not necessarily, located between the source of electromagnetic radiation and the test optic. Examples of suitable beam dividers include reflection type diffraction gratings, transmission type diffraction gratings, and polarization beamsplitters. PS/PDI systems are generally described in Medicki, U.S. Pat. No. 5,835,217, which is incorporated by reference.

The PS/PDI, as previously implemented, has been directed exclusively at measuring wavefront aberrations. In lithographic optics, however, it is equally important to minimize distortion. Here an improved PS/PDI is described that addresses the distortion characterization.

Distortion can be viewed generally as a shift of the image-point position relative to the ideal position. To describe how the PS/PDI is used to measure distortion, a simplifying assumption is initially made that the interferometer can be perfectly aligned such that with a distortion-free optical system the test beam would be centered in the PS/PDI-mask test-window and the reference beam would be centered on the reference pinhole. (This assumption is in actual implementation as described herein.)

Figure 2A:
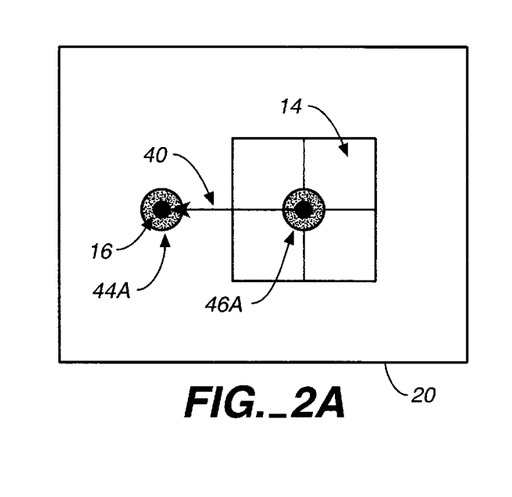
FIGS. 2A and 2B are schematics of the image-plane mask with (a) a distortion-free optic and (b) an optic with small distortion, respectively.
Figure 2B:
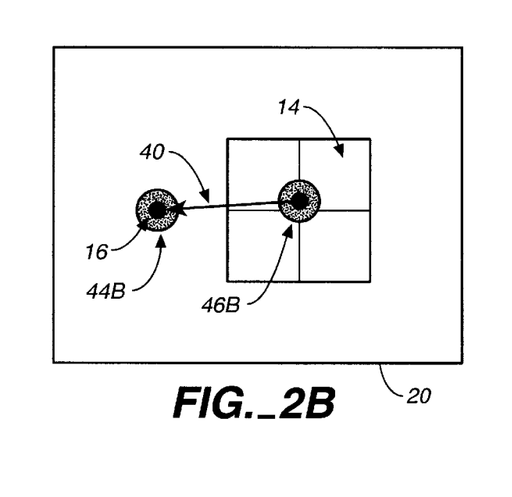

Referring to FIG. 2A, under this perfect-alignment assumption, a distortion-free optic would produce an interferogram with a tilt term that is determined by the separation of the reference pinhole 16 from the center of the test-window 14 of image plane mask 20 as represented by the tilt vector 40. The tilt vector is measured from the center of the test beam 46A to the center of the reference pinhole 16. As is apparent, in the case of perfect-alignment, the centers of the test beam 46A and reference beam 46B coincide with the centers of the test window and reference pinhole, respectively. The tilt term in the interferogram is determined from the frequency and orientation of the interference fringes produced by the overlapping test and reference beams on the CCD. If, on the other hand, the distortion-free optic is replaced by an optic with distortion and the alignment of the entire interferometer remained undisturbed, the test- and reference-beams 44B and 46B would simply move in unison in the image plane, as shown in FIG. 2B. The two beams move in unison because of the nearly common-path configuration of the PS/PDI.

If the distortion is small relative to the optical system PSF, the distortion could be measured directly from the interferogram tilt term, which is determined by the separation of the test-beam 46B and the reference pinhole 16, as depicted by the vector in FIG. 2B. However, if the distortion is large relative to the PSF such that the reference-beam intensity falling on the pinhole becomes very small, there is the additional complication that the interferometry would no longer be possible without repositioning the PS/PDI-mask because the reference-beam would be too weak relative to the test beam to get adequate fringe contrast. In this case the distortion could be measured by moving the image-plane mask 20 using a high-accuracy stage 30 (FIG. 1) until the measured tilt matches the distortion-free tilt. The stage displacement would then be a measure of the distortion.

The tilt term referred to above is measured directly from the interferogram. It is the linear phase component of the wavefront reconstructed from the interferogram. Given the known wavelength and distance from the image plane to the CCD, the tilt term can be used to calculate the linear separation between the reference pinhole giving rise to the reference beam and the test beam. The linear image-plane separation $\bar{s}$ is approximately $\bar{f} \lambda Z$, where $\bar{f}$ is the linear phase vector, $\lambda$ is the wavelength, and Z is the image-plane-to-CCD distance.

The above description is predicated on the assumption that the interferometer can be perfectly aligned, so that it is possible to measure absolute distortion at any point. In actuality, perfect pre-alignment is not practical, therefore, it is not practical to measure absolute distortion. However, it is feasible to measure the relative distortion across the field, which in practice is the measurement of interest.

For relative distortion measurements, a grid of object points (e.g., pinholes) is defined and the relative positions of all the image points are measured. In this case the distortion is arbitrarily set to zero at the first point measured, which means that the entire grid may be displaced relative to its ideal position. The measurement of interest, however, is how well the image grid spacing match the ideal spacing. This is crucial in a scanning imaging system such as those used in optical lithography because spatially variant image shift will translate to image blur (i.e., loss of resolution) in the final scanned image. Absolute placement error of the whole grid, however, will not affect scanned image quality.

The image-point position measurement described above is achieved by placing a properly demagnified grid of PS/PDI masks in the image plane matching the grid of pinholes in the object plane. The illuminating beam in the object plane is then moved from pinhole to pinhole and interferometry (i.e., the tilt term) is used to determine the image-point position relative to the test-beam window center. In a distortion-free system, all the image points will fall exactly in the center of all the image-plane test-beam windows, thereby creating the same tilt term at each measurement point; however, if distortion is present it will be necessary to move the image-plane grid to achieve the proper alignment. This is initially done at some point which becomes our reference point. After the illumination is moved to the next object pinhole a new interferogram is recorded and again the tilt term is used to determine the beam position. Alternatively, if the image-plane shift is too large (i.e., the image point no longer falls on the reference pinhole) the stage is repositioned as described above. The stage position is set such that the measured tilt matches that measured at the reference point. The stage displacement now serves as a measure of the distortion. This process is repeated across the grid of pinholes.

Alternatively, in another embodiment of the invention, if stages of adequately long travel and high accuracy are available in the image or object planes, the pinhole arrays could be replaced by a single pinhole. In this case, the stages themselves would define the relative separations of the measured object and image points.

As described for the pinhole array embodiment, the distortion is arbitrarily set to zero at the first point measured. The tilt term measured at this point becomes the reference tilt. The object pinhole is then repositioned by a known amount using the accurate object stage, furthermore, the illumination is also made to follow the pinhole, although little accuracy is required of this motion as long as sufficient light is coupled through the pinhole to enable the interferometric measurement. The next step is to reposition the image pinhole using the image-plane stage such that interferometry can again be performed and the same tilt as the reference tilt is measured. The distortion is now the difference between the actual image-stage displacement and that predicted from the ideal demagnification of the object-stage displacement.

Figure 3:
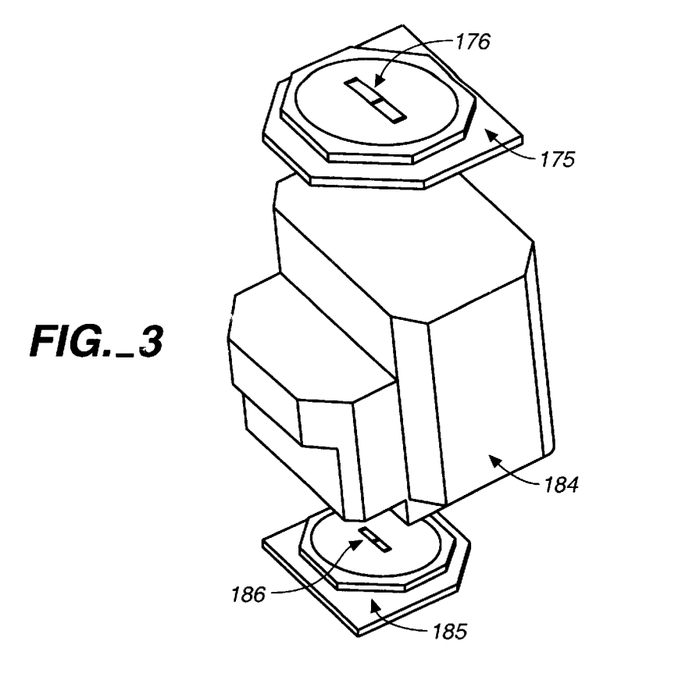
FIG. 3 illustrates modifications to the PS/PDI to implement distortion measurements.

FIG. 3 shows modifications to the PS/PDI device of FIG. 1 that enhance the device's ability to measure distortion in the pinhole array embodiment. Specifically, the improvements include (1) positioning pinhole array 176 (illustrated in detail in FIG. 4A) in place of the substrate 63 which has object pinhole 6 (FIG. 1) and (2) positioning a PS/PDI-mask array 186 (illustrated in detail in FIG. 4B) in place of the image-plane mask 120. The projection optics box (POB) 184, which is described further herein in FIG. 5, is the optical system 2 represented in FIG. 1. The POB is positioned between object-plane stage 175 and image-plane stage 185 of the PS/PDI. As further described herein, the wavefront-aberration and alignment measurements are aided by the pinhole array 176 which is supported and manipulated by object-plane stage 175 and the PS/PDI-mask array 186 which is positioned on the image-plane stage 185. (While the invention is illustrated in connection with the POB, it is understood the it can be employed to measure distortion of any optical device.)

Figure 4A:
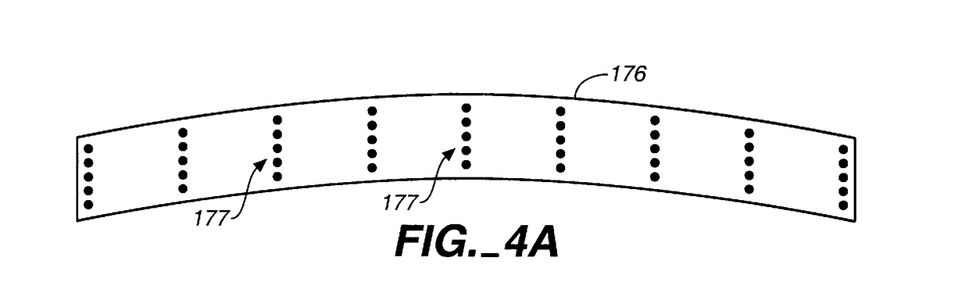
FIGS. 4A and 4B depict the object plane pinhole array and image plane PDI mask array, respectively.
Figure 5:
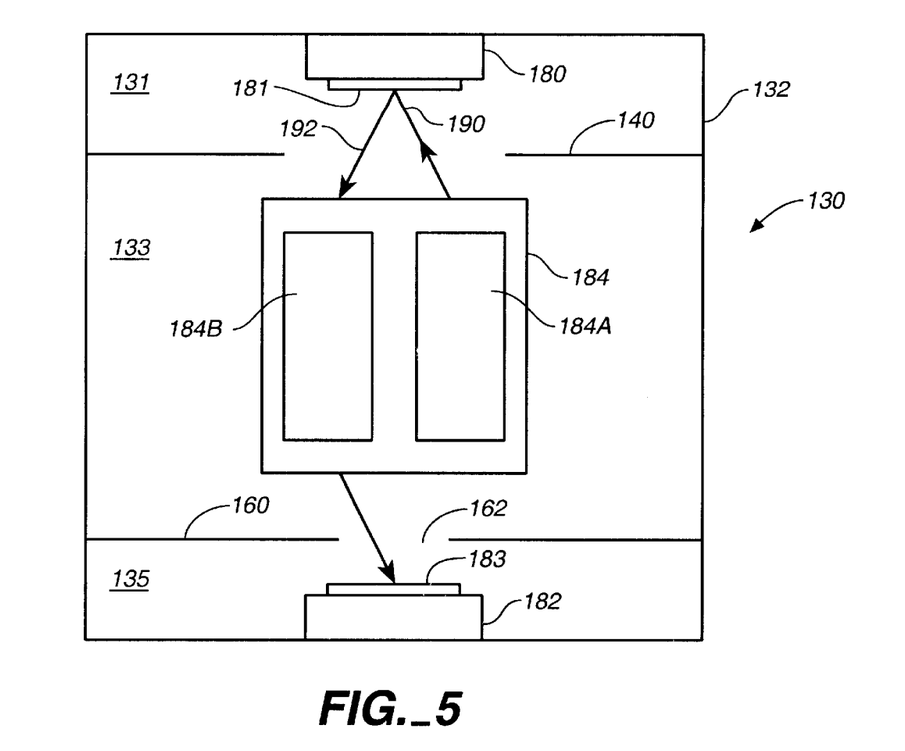
FIG. 5 is a schematic of a photolithography device including the reticle, optics, and wafer zones.

FIG. 4A illustrates the object-plane pinhole array 176 which includes a plurality or field of pinholes 178 fabricated on an opaque substrate. In this embodiment, the field includes 9 columns and 5 rows of pinholes that form an arc-shape arrangement. Each pinhole is typically in the range of 150 to 500 nm in diameter. The distance between the centers of pinholes in adjacent columns is about 13 mm and the distance between adjacent pinholes in the same column is about 3 mm.

Figure 4B:
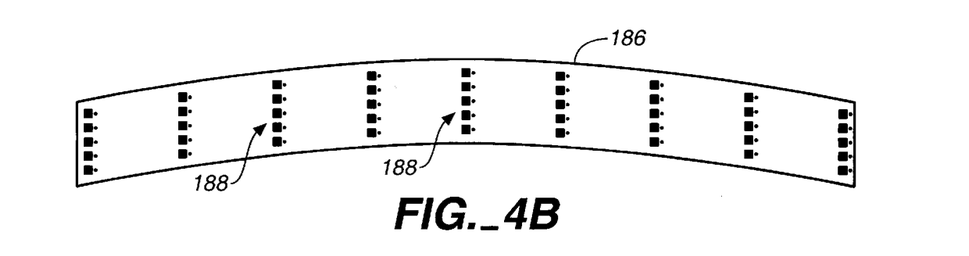

FIG. 4B illustrates the image-plane PS/PDI-mask array 186 which includes a plurality or field of test windows and associated reference pinholes which are collectively identified by reference 188 that are fabricated on an opaque substrate. The field includes 9 columns and 5 rows of test window/reference pinholes that form an arc-shape arrangement. Typically the dimensions of the windows range from about 3×3 $\mu$m to 5×5 $\mu$m. Each reference pinhole is typically in the range of 80 to 120 nm in diameter. The distance between the centers of windows in adjacent columns is about 3.25 mm and the distance between the centers of windows within the same column is about 0.25 to 0.75 mm. Furthermore, the distance between each window and its corresponding reference pinhole is about 5 $\mu$m.

As is apparent, the positions of the windows and adjacent reference pinholes in the image-plane mask array (FIG. 4B) register with the positions of pinholes in the object-plane pinhole array (FIG. 4A) meaning that, if there were no distortion in the POB and the two arrays are perfect, the 45 test beams would be imaged in the center of the 45 test widows of the image-plane mask array. Because lithographic systems are typically demagnifying, the overall dimensions of the image-plane mask array is typically smaller than that of the object-plane pinhole. The size ratio is set by the demagnification of the optic. All relative distances between features will also be appropriately established. For instance, if the demagnification is 10 and the object pinhole separation is 100 mm, then the image-plane test-beam window separation will be 10 mm.

The relative size of the object-plane pinhole array and the image-plane mask array will depend, on the POB design. For photolithography, the image-plane mask array will be a demagnified grid that is smaller than the object-plane pinhole array. The above dimensions for image-plane array is for a 4× reduced version of the object-plane array.

To account for potential placement errors in the object and image plane arrays, these arrays most preferably should be independently characterized. This can be achieved by using conventional mask metrology tools such as the Leica LMS IPRO. The final accuracy of the distortion measurement described here will be limited by the metrology performed on the arrays or, for the non-array case, the accuracy of the image and object plane stages. Current state-of-the-art metrology tools provide 1$\sigma$ accuracy of approximately 1 nm. Current state-of-the-art EUV lithography optics required distortion control on the order of 10 nm, thus the method presented here provides ample accuracy.

The phase-shifting point diffraction interferometer of the present invention can be employed to measure both wavefront-aberration and distortion of any optic system. It is particularly suited for measuring the projection optics employed in EUV photolithography. FIG. 5 depicts the cross-sectional view of a preferred EUV photolithography vacuum apparatus 30 that preferably has a cylindrical cross section. The apparatus includes a housing having an outer enclosure 32 and three inner chambers or zones 131, 133, and 135. The zones are created by reticle metrology tray 40 and wafer metrology tray 60. Reticle metrology tray 40 separates reticle zone 31 from optics zone 33. In a similar manner, wafer metrology tray 60 separates wafer zone 35 from optics zone 33.

The reticle zone 31 encases reticle stage 80 with reflective reticle or mask 81 attached thereto. The optics zone 33 encases projection optics devices that are collectively situated in projection optics box (POB) 84. In a preferred embodiment, EUV radiation is collected from a source (not shown) and a plurality of beams from the source are transformed into a plurality of substantially parallel arc-shaped light beams which are directed through opening 88 to processing and imaging device 84A which transmit a plurality of arc-shaped light beams 90 to reflective mask 81. The reflected light 92 is then translated as beam 94 by camera 84B to wafer 83 that is positioned on wafer stage 82 within wafer zone 35.

To accommodate the transmission of the EUV radiation, reticle metrology tray 40 has aperture 42 through which the light beams 90 and 92 enter and exit. Wafer metrology tray 60 includes a window 62 that is made of material having a high EUV radiation transmission factor such as beryllium. The wafer metrology tray 60 also serves a barrier that prevents contaminants in the wafer zone from entering the optics zone.

The radiation source is preferably a laser plasma source that emits EUV radiation. The individual elements that form the EUV lithography device as shown in FIG. 5 can comprise conventional optical devices, e.g., condensers, cameras, and lens, for projection EUV lithography. Preferably the EUVL device employs a condenser that collects EUV radiation for illuminating a ringfield camera.

As is apparent, rather than removing the POB from the EUV photolithography system for testing, another implementation of the invention would be to construct the PS/PDI into the system. In this fashion, wavefront aberration and distortion measurements can be readily made prior to operation. This, however, would require an alternate EUV source which could provide adequate coherent power as opposed to the incoherent light provided by the laser plasma source.

In operation, to implement the interferometric at-wavelength distortion measurements of the POB, the PS/PDI is modified with the pinhole array and PS/PDI mask array and the POB is positioned between the pinhole and mask arrays as shown in FIG. 3. Radiation from the radiation source is directed into pinhole 201 of object-plane pinhole array 176 (FIG. 4A) thereby creating a test beam and reference beam that pass through the POB before being imaged on the mask array 186. If there is no distortion, the image point of the test beam will lie in the middle of window 201A of image-plane mask array 186 (FIG. 4B). However, with distortion, this image point would be focused at a point on the substrate typically near window 201A. The image stage is then used to center the beam in window 201A. Once this is achieved the tilt term is measured which becomes the reference tilt for all subsequent points.

Thereafter, the entire PS/PDI device (other than the illumination source, e.g., beamline, grating, and CCD) is moved so that radiation is directed into pinhole 202 of pinhole array 176 and the image is focused at a second point on the substrate of the mask array 186 near window 202B. Again, the position of this second point is recorded. The process is repeated until radiation has been directed through all 45 pinholes in pinhole array 176 and the positions where the image is focused on mask array 186 are recorded. This procedure covers the entire field of interest. The recorded positions represent the data for the initial "coarse" adjustment to the POB (or the components therein) which can be accomplished using conventional computer simulation techniques.

Following the coarse adjustment, the above procedure is repeated, namely, the radiation from the radiation source is directed into pinhole 201 of pinhole array 176 (FIG. 4A) thereby creating test and reference beams that travel through the POB before being imaged on the mask array 186. With distortion having been reduced, the test and reference beams would be imaged on the substrate sufficiently close to window 201A and corresponding reference pinhole as illustrated in FIG. 2B. Given that the distortion should be small relative to the optical system PSF, the distortion at this stage can be measured directly from the interferogram tilt term as described above. This information is recorded and the procedure is repeated for the remaining 44 pinholes in the pinhole array and their corresponding windows in the mask array. Once this second process is completed, "fine" adjustments can be made to the POB (or components therein) to account for the distortion.

The embodiments specifically disclosed here have addressed techniques that use the EUV PS/PDI to characterize an EUV lithographic optic. The method described here can be equally well adapted to any imaging optical system with real conjugates and any wavelength at which point diffraction interferometry is possible. Furthermore, the wavelength used to perform the interferometry need not be the same wavelength as used in normal operation of the optical system. For example, this method could be applied to visible-light interferometry performed on EUV optics.

In addition, the embodiments specifically disclosed here have been described assuming the use of a point diffraction interferometer where the diffraction is provided by pinholes. It is understood that these teachings are equally valid when applied to point diffraction interferometers using alternative diffracting apertures. One such alternative aperture device employs optical fibers such as in the phase shifting diffraction interferometer described in Sommargren et al., "Phase Shifting Diffraction Interferometry for Measuring Extreme Ultraviolet Optics", *OSA TOPS on Extreme Ultraviolet Lithography*, 1996, Vol. 4, pp 108–112, Kubiak and Kania (eds.) and Sommargren U.S. Pat. No. 5,548,403 which are incorporated herein by reference. This visible-light phase shifting diffraction interferometer is similar to the PS/PDI but employs optical fibers instead of pinholes and works in reflection on the measurement side. Another alternative aperture device employs point reflectors.

The basic principle of operation of the phase shifting diffraction interferometer using a single mode optical fiber is as follows: Light leaving the end of the single mode optical fiber diffracts to a spherical wavefront over an extended angular range. Part of this wavefront is incident on the optic under test and is reflected back toward the fiber. This aberrated wavefront reflects from a semi-transparent metallic film on the face of the fiber and interferes with part of the original spherical wavefront to produce the interference pattern. In one embodiment, in the interferometer for testing optics the end of the fiber is place at a common conjugate. In this configuration two temporally incoherent beams are launched into the same fiber. One beam is first reflected from a retroreflector mounted to a piezoelectric phase shifter and the other beam is delayed by a path length equal to the round-trip distance between the fiber face and the optic under test. Interference on a CCD camera takes place between the phase shifted wavefront that is reflected from the optic under test and the delayed wavefront diffracted directly from the fiber.

In another embodiment, in the interferometer for testing optics the ends of two fibers are placed at spatially separated conjugates. Here the two beams are launched into separate equal length fibers and the beam delay is equal to the path length between the fiber ends. Interference on a CCD camera takes place between the phase shifted wavefront from the first fiber that is transmitted through the optic under test and the delayed wavefront from the second fiber. In both configurations the optic under test is imaged onto the CCD camera.

The method of the present invention can be readily applied to any point-to-point interferometer including the one developed by Sommargren described above.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A system for interferometric distortion measurements that defines an optical path, said system comprising:
   (a) a test optic with an extended field of view;
   (b) a source of electromagnetic radiation in the optical path;
   (c) an object-plane pinhole array comprising a plurality of object pinholes with known positions located between the test optic region and the source of electromagnetic radiation whereby energy passing through any one of the plurality of object pinholes is spatially coherent;
   (d) a beam divider in the optical path for dividing electromagnetic radiation from the source into a reference beam and a test beam;
   (e) an image-plane mask array that is positioned in the image plane of the test optic wherein the image-plane mask array comprises a plurality of test windows and corresponding reference pinholes of known positions, wherein the positions of the plurality of object pinholes in the object-plane pinhole array register with those of the plurality of test windows in image-plane mask array accounting for possible optic demagnification; and
   (f) means for directing electromagnetic radiation from the source of electromagnetic radiation into a first object pinhole of the object-plane pinhole array to thereby create a first corresponding test-beam image on the image-plane mask array.

2. The system of claim 1 wherein the means for directing the electromagnetic radiation comprises means for directing the electromagnetic radiation successively through the first object pinhole and thereafter to one or more other object pinholes of the plurality of object pinholes of the object-plane pinhole array.

3. The system of claim 1 wherein the beam divider is a diffraction grating.

4. The system of claim 1 wherein the diffraction grating is positioned between the source of the electromagnetic radiation and the optical element.

5. The system of claim 1 wherein the object pinholes in the object-plane pinhole array have a diameter that range from about 150 nm to 500 nm.

6. The system of claim 1 wherein each window of the image-plane mask array defines an opening with an area of about 9 micron$^2$ to 25 micron$^2$.

7. The system of claim 1 wherein the electromagnetic radiation has a wavelength in the range from 5 nm to 20 nm.

8. A method of measuring the distortion of a test optic defining multiple field points which comprises the steps of:
   (a) providing a phase-shifting point diffraction interferometer defining an optical path that includes (i) a test optic having a test optic region at which the test optic defines multiple field points, (ii) a source of electromagnetic radiation in the optical path, (iii) an object-plane pinhole array comprising a plurality of object pinholes of known positions located between the test optic region and the source of electromagnetic radiation whereby energy passing through any one of the plurality of object pinholes is spatially coherent, (iv) a beam divider in the optical path for dividing electromagnetic radiation from the source into a reference beam and a test beam, (v) an image-plane mask array that is positioned in the image plane of the test optic region wherein the image-plane mask array comprises a plurality of test windows and corresponding reference pinholes of known positions wherein the positions of the plurality of object pinholes in the object-plane pinhole array register with those of the plurality of test windows in the image-plane mask array accounting for possible optic demagnification;
   (b) directing electromagnetic radiation from the source of electromagnetic radiation into a first object pinhole of the plurality of object pinholes of the object-plane pinhole array to thereby create a corresponding first test-beam image and reference-beam image on the image-plane mask array;
   (c) measuring the separation distance between and the orientation of the test-beam image and the center of the test-beam window; and
   (d) repeating steps (b) and (c) for at least one other object pinhole of the plurality of object pinholes of the object-plane pinhole array.

9. The method of claim 8, wherein the phase-shifting point interferometer includes an image-plane stage which supports the image-plane mask array and steps (c) and (d) comprise:
   (i) positioning the image-plane stage such that the test beam is approximately centered in the test-beam window;
   (ii) using interferometry to record a tilt term which serves as a reference tilt for subsequent points;
   (iii) directing electromagnetic radiation from the source into a second object pinhole of the plurality of object pinholes of the object plane array;
   (iv) translating the image-plane stage such that the interferometrically measured tilt term matches the reference tilt;
   (v) recording the translation of the image stage performed in step (iv); and
   (vi) optionally repeating steps (iii) through (v) for at least one other object pinhole of the plurality of object pinholes of the object-plane pinhole array.

10. The method of claim 9 wherein step (iv) comprises interferometrically measuring the tilt term and step (v) comprises:
   (1) calculating the reference-pinhole-to-test-beam separation corresponding to the measured tilt term;
   (2) calculating the reference-pinhole-to-test-beam separation corresponding to the reference tilt;
   (3) calculating the translation, as the difference between the separations calculated in steps (1) and (2).

11. The method of claim 8 wherein the beam divider is a diffraction grating.

12. The method of claim 8 wherein the diffraction grating is positioned between the source of the electromagnetic radiation and the optical element.

13. The method of claim 8 wherein the object pinholes in the object-plane pinhole array have a diameter that range from about 150 nm to 500 nm.

14. The method of claim 8 wherein each window of the image-plane mask array defines an opening with an area of about 9 micron$^2$ to 25 micron$^2$.

15. The method of claim 8 wherein the electromagnetic radiation has a wavelength in the range from 5 nm to 20 nm.

16. A method of measuring the distortion of a test optic which comprises the steps of:
   (a) providing a diffraction interferometer defining an optical path that includes (i) an imaging system with real conjugates, (ii) a test optic with an extended field of view, (iii) a source of electromagnetic radiation in the optical path, and (iv) a beam divider in the optical path for dividing the electromagnetic radiation into at least two beams;
   (b) measuring a first interferometric pattern of the two beams at a first arbitrary field point within the optic's field of view, said point providing a reference wherein the distortion is defined to be zero;
   (c) measuring a second interferometric pattern of the two beams at a second arbitrary field point within the optic's field of view; and
   (d) calculating the distortion in the test optic by comparing the measurements made in step (c) to the measurement made in step (b).

17. The method of claim 16 further comprising the step of repeating steps (d) and (c) for one or more arbitrary field points.

18. The method of claim 16 wherein step (b) comprises measuring a first reference tilt term from the interferometric pattern and step (c) comprises measuring a second tilt term from the interferometric patterns and step (d) comprises calculating the distortion of the test optic by comparing the first reference tilt term to the second tilt term.

19. A method of measuring the distortion of a test optic which comprises the steps of:
   (a) providing a diffraction interferometer defining an optical path that includes (i) means for separating a beam of light into a reference beam and a test beam and (ii) a test optic with an extended field of view;
   (b) measuring a first interferometric pattern of the two interferometric beams at a first arbitrary field point within the optic's field of view, said point providing a reference wherein the distortion is defined to be zero;
   (c) measuring a second interferometric pattern of the two beams at a second arbitrary field point within the optic's field of view; and
   (d) calculating the distortion in the test optic by comparing the measurements made in step (c) to the measurement made in step (b).

20. The method of claim 19 further comprising the step of repeating steps (d) and (c) for one or more arbitrary field points.

21. The method of claim 19 wherein step (b) comprises measuring a first reference tilt term from the interferometric pattern and step (c) comprises measuring a second tilt term from the interferometric pattern and step (d) comprises calculating the distortion of the test optic by comparing the first reference tilt term to the second tilt term.

22. The method of claim 19 wherein the coherent beam of light comprises visible light.

23. The method of claim 19 wherein step (a) comprises providing a diffraction interferometer that includes means for separating a linearly polarized, collimated and coherent beam of light into a reference beam and a test beam.

* * * * *